(12) United States Patent
Yamashita

(10) Patent No.: US 7,721,417 B2
(45) Date of Patent: May 25, 2010

(54) MANUFACTURING METHOD FOR SEMICONDUCTOR DEVICE HAVING A THIN FILM RESISTOR

(75) Inventor: Michio Yamashita, Okazaki (JP)

(73) Assignee: DENSO CORPORATION, Kariya (JP)

( * ) Notice: Subject to any disclaimer, the term of this patent is extended or adjusted under 35 U.S.C. 154(b) by 865 days.

(21) Appl. No.: 11/407,046

(22) Filed: Apr. 20, 2006

(65) Prior Publication Data

US 2007/0018781 A1     Jan. 25, 2007

(30) Foreign Application Priority Data

Jul. 21, 2005    (JP)   .............................. 2005-211811

(51) Int. Cl.
*H01C 17/00*     (2006.01)
(52) U.S. Cl. .................. 29/610.1; 29/620; 219/121.67; 219/121.68; 219/121.69; 257/E21.004
(58) Field of Classification Search ................ 29/610.1, 29/620; 219/121.67–121.69; 257/E21.004; 338/195, 308, 309
See application file for complete search history.

(56) References Cited

U.S. PATENT DOCUMENTS

| 4,228,418 | A | 10/1980 | Piedmont et al. |
| 4,906,966 | A | 3/1990 | Imamura et al. |
| 5,081,439 | A | 1/1992 | Natzle et al. |
| 5,379,190 | A | 1/1995 | Hanamura et al. |
| 5,394,019 | A | 2/1995 | Audy |
| 5,569,398 | A * | 10/1996 | Sun et al. ............... 219/121.68 |
| 6,940,038 | B2 * | 9/2005 | Biunno et al. .......... 219/121.69 |

FOREIGN PATENT DOCUMENTS

| EP | 0 829 885 | 3/1998 |
| JP | A-S60-031261 | 2/1985 |
| JP | A-S63-172406 | 7/1988 |
| JP | A4-155937 | 5/1992 |
| JP | A5-55015 | 3/1993 |
| JP | B2-2967066 | 8/1998 |
| JP | A-H11-135726 | 5/1999 |
| JP | A-2001-267498 | 9/2001 |

OTHER PUBLICATIONS

Office Action dated Jul. 14, 2009 from the Japan Patent Office in the corresponding JP application No. 2005-211811 (and English Translation).
Office Action mailed Mar. 4, 2010 from the U.S. Patent Office in the corresponding divisional U.S. Appl. No. 12/292,352.

* cited by examiner

*Primary Examiner*—Thiem Phan
(74) *Attorney, Agent, or Firm*—Posz Law Group, PLC

(57) ABSTRACT

A method of evaluating laser trimming of a semiconductor device having a thin film resistor is disclosed. The method includes the steps of providing the thin film resistor and laser trimming the thin film resistor by creating a first trim cut. The first trim cut bisects the thin film resistor such that the thin film resistor is divided into a first portion and a second portion. Also, the method involves measuring the insulation resistance of the thin film resistor. In addition, the method involves evaluating the trim cut based on the measured insulation resistance.

15 Claims, 7 Drawing Sheets

MANUFACTURING METHOD FOR SEMICONDUCTOR DEVICE HAVING A THIN FILM RESISTOR

CROSS REFERENCE TO RELATED APPLICATION

This application is based upon and claims the benefit of priority of Japanese Patent Application No. 2005-211811 filed on Jul. 21, 2005, the content of which is incorporated herein by reference.

FIELD OF THE INVENTION

The present invention relates generally to laser trimming, and more particularly relates to a semiconductor device having a trim cut and a method of evaluating the laser trimming of the semiconductor device.

BACKGROUND OF THE INVENTION

Laser trimming is used for trimming a thin film resistor (see U.S. Pat. No. 5,081,439 and Japanese Patent No. 2,618,139 for example). Specifically, as shown in FIGS. 10A and 10B, a thin film resistor 102 is formed on a top surface of a silicon substrate 100 of an IC chip. An insulation film 101 is interposed between the thin film resistor 102 and the silicon substrate 100. Also, electrodes 103, 104 are disposed at opposite ends of the thin film resistor 102. Trimming is performed by irradiating the thin film resistor 102 with a laser beam to form a trim cut 105. In the embodiment shown, for instance, an L-shaped trim cut 105 is formed.

It is known that the quality of trim cuts created during laser trimming can vary. For instance, the cutting quality of a linearly polarized laser beam may be adequate in one linear direction, but uncut strips may remain when trimming in another linear direction. Also, trimming at an inadequate laser intensity (i.e., a shortage of the laser beam energy) can cause defects to be created in the resistor. Defects can also be created due to improper focusing of the laser beam and/or due to a relatively small trimming window (i.e., a relatively small width of trimming energy over which a favorable cut can be achieved).

The resistor can be visually examined to detect defects; however, a visual examination may not reveal certain defects. In addition, the resistor can be electrically evaluated for detecting defects. However, an electrical evaluation may not reveal certain defects, especially if the trim cut is relatively long. This is because the electrical characteristics of the resistor are more likely to fall within acceptable ranges as the length of the trim cut increases.

More specifically, as shown in FIG. 11A, a thin film resistor 102 has been trimmed using a linearly polarized laser beam. The trim cut 105 includes a first trim cut 105a, which extends in the Y-direction, and a second trim cut 105b, which extends in the X-direction. As shown, the cutting ability of the linearly polarized laser beam is reduced when trimming in the X-direction as compared to trimming in the Y-direction. In other words, uncut parts remain in the second trim cut 105b, and the uncut parts could be detected with a visual examination. However, uncut parts in the first trim cut 105a, if any, are not obviously present, and such defects would be difficult to detect with a visual examination.

FIG. 11B also shows an example of trimming using a linearly polarized laser beam, in which the trim cut 105 is formed in the Y-direction only. In this case, uncut parts, if any, are not obviously present in the trim cut 105 because it extends in the Y-direction only. Thus, defects in the trim cut 105 of FIG. 11B would be difficult to detect with a visual examination.

FIG. 11C shows an example of trim cuts 105a, 105b disposed in an L-shape and formed using a circularly polarized laser beam. As shown, uncut parts, if any, are not obviously present in the trim cuts 105a, 105b because the circularly polarized laser beam was used. As such, any defects in the trim cuts 105a, 105b would be difficult to detect with a visual examination.

SUMMARY OF THE INVENTION

The present disclosure relates to a method of evaluating laser trimming of a semiconductor device having a thin film resistor. The method includes the steps of providing the thin film resistor and laser trimming the thin film resistor by creating a first trim cut. The first trim cut bisects the thin film resistor such that the thin film resistor is divided into a first portion and a second portion. Also, the method involves measuring the insulation resistance of the thin film resistor. In addition, the method involves evaluating the trim cut based on the measured insulation resistance.

In another aspect, the present disclosure relates to a method of determining an operative laser intensity for laser trimming. The method includes the step of laser trimming a first thin film resistor by creating a first trim cut at a laser intensity of a predetermined value. The first trim cut bisects the first thin film resistor. The method also includes measuring insulation resistance of the first thin film resistor. In addition, the method includes the step of determining the operative laser intensity based on the measured insulation resistance of the first thin film resistor. Furthermore, the method includes laser trimming a second thin film resistor at the operative laser intensity.

In still another aspect, the present disclosure relates to a semiconductor device that includes a first thin film resistor and a first pad operatively coupled to the first thin film resistor. The semiconductor device further includes a second pad operatively coupled to the first thin film resistor. The semiconductor device also includes a first trim cut that bisects the first thin film resistor between the first pad and the second pad. Furthermore, the semiconductor device includes a measuring device in electrical communication with the first pad and the second pad. The measuring device is operable for measuring an insulation resistance of the first thin film resistor so as to evaluate the first trim cut.

DESCRIPTION OF THE PREFERRED EMBODIMENTS

Figure 1:
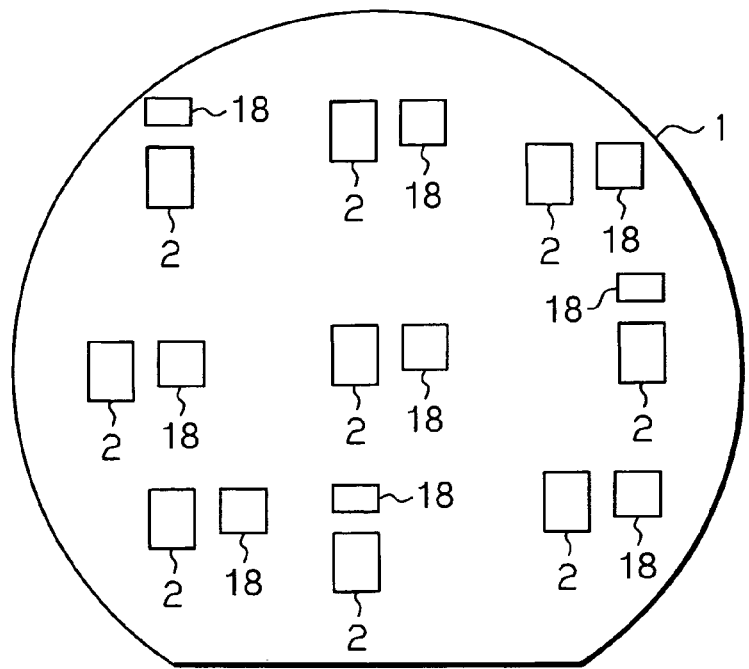
FIG. 1 is a plan view of a semiconductor device.

One embodiment of the invention will now be described with reference to the drawings. FIG. 1 shows a wafer 1 that includes a plurality of first thin film resistors 2 and a plurality of second thin film resistors 18. In one embodiment, the first and second resistors 2, 18 are metal thin film resistors. It will be appreciated that the wafer 1 could include any number of first and second resistors 2, 18. It will also be appreciated that the wafer 1 could include only the first resistors 2. Furthermore, it will be appreciated that the first and second resistors 2, 18 could be included in any suitable pattern on the wafer 1.

As will be explained in greater detail below, one or more of the first resistors 2 is laser trimmed and then evaluated in a manner to be described. By evaluating the trimmed first resistor 2, appropriate parameters can be determined for the laser trimming of the second resistors 18. In one embodiment, the first resistors 2 are used only for evaluation of the laser trimming process, and the second resistors 18 are used as electrically resistive components for circuits in the wafer 1.

Figure 2A:
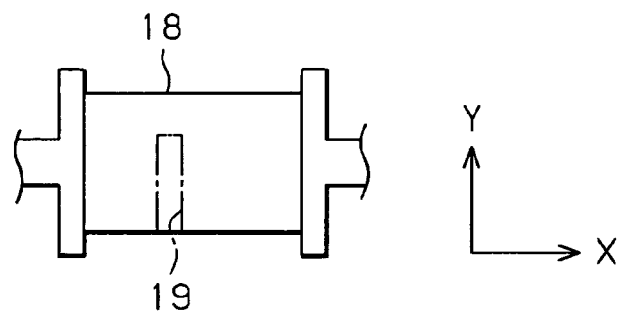
FIGS. 2A and 2B are plan views of resistors included on the wafer of FIG. 1.
Figure 2B:
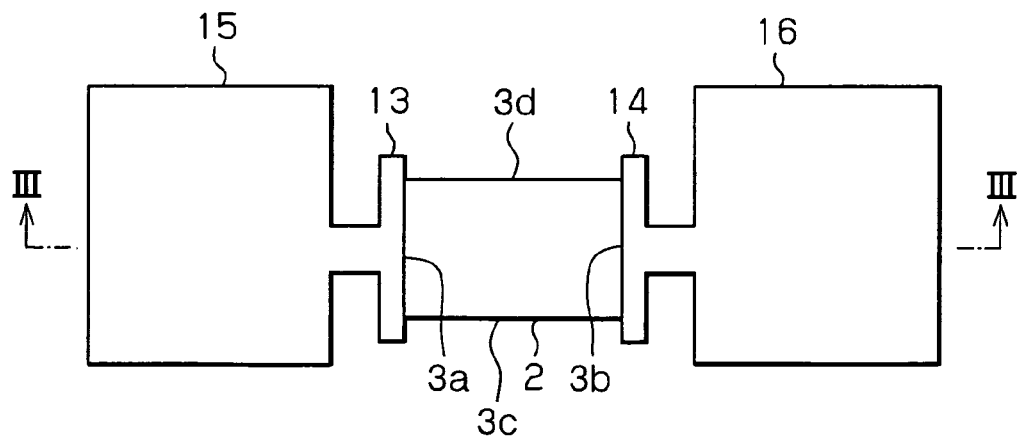

FIGS. 2A and 2B show a first thin film resistor 2 and a second thin film resistor 18. As will be explained, the appropriate laser trimming parameters for trimming the second resistor of FIG. 2A is discovered by laser trimming the first resistor 2 of FIG. 2B and then evaluating the laser trimming of the first resistor 2 of FIG. 2B.

In the embodiment shown, the first resistor 2 is rectangular shaped so as to define a first edge 3a, a second edge 3b, a third edge 3c, and a fourth edge 3d. In one embodiment, the shape of the first resistor 2 corresponds to that of the second resistor 18. However, it will be appreciated that the first and second resistors 2, 18 can have any suitable shape.

Figure 3:
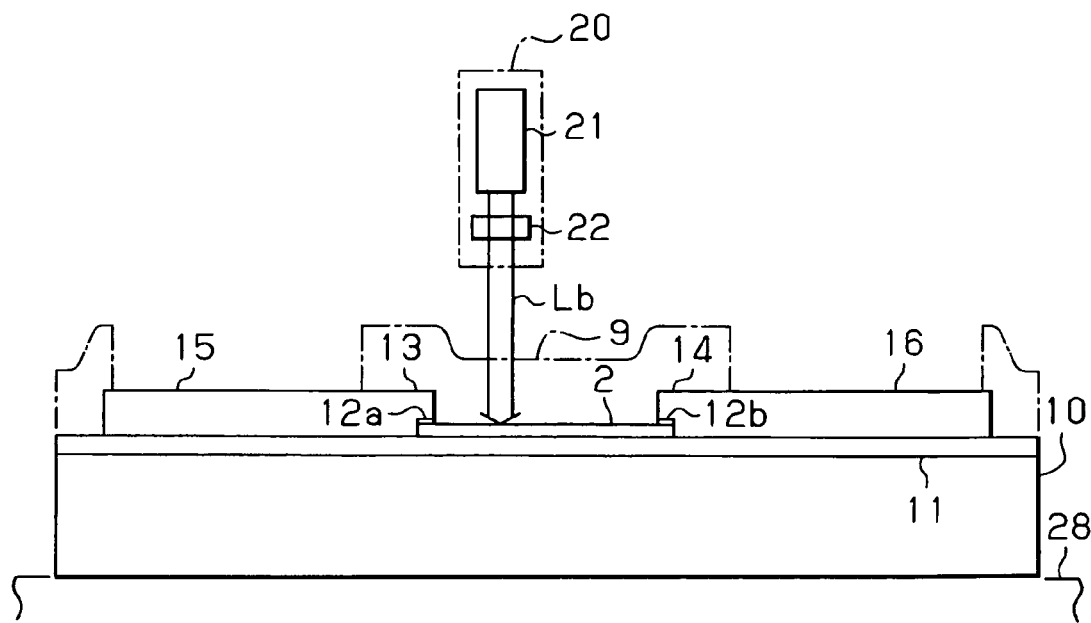
FIG. 3 is a longitudinal sectional view taken along the line III-III of FIG. 2B.

As shown in FIG. 3, the first resistor 2 is disposed on a silicon substrate 10 of the wafer 1 with an insulation film 11 interposed between the first resistor 2 and the silicon substrate 10. The wafer 1 (i.e., the silicon substrate 10) is chucked on an X-Y table 28, and the wafer 1 is moved as a result of horizontal movement of the X-Y table 28 (i.e., back and forth and to the left and right).

A laser apparatus 20 is provided above the X-Y table 28. The laser apparatus 20 includes a laser oscillator 21 and a linear polarizer 22. In one embodiment, the laser apparatus 20 includes a galvanometer scanner, and the linear polarizer 22 is a polarizing plate. A laser beam (labeled "Lb") is output by the laser oscillator 21, passes through the linear polarizer 22, and is applied to the first thin film resistor 2 to thereby trim the first resistor 2 in a manner to be described. It will be appreciated that the laser apparatus 20 could output any suitable laser beam Lb, including but not limited to a linearly polarized laser beam Lb and a circularly polarized laser beam.

Referring to FIGS. 2B and 3, the wafer 1 includes a first electrode 13 and a second electrode 14. The first resistor 2 is interposed between the first electrode 13 and the second electrode 14. More specifically, the first electrode is disposed adjacent the first side 3a of the first resistor 2, and the second electrode 14 is disposed adjacent the second side 3b of the first resistor 2. Also, a first pad 15 is electrically connected to the first electrode 13, and a second pad 16 is electrically connected to the second electrode 14. In one embodiment, the first pad 15, the second pad 16, the first electrode 13, and the second electrode 14 are each made out of aluminum. Also, in one embodiment, the first pad 15 is integrally connected to the first electrode 13, and the second pad 16 is integrally connected to the second electrode 14.

A first barrier metal layer 12a is interposed between the first electrode 13 and the first resistor 2, and a second barrier metal layer 12b is interposed between the second electrode 14 and the first resistor 2. As such, the first pad 15 is electrically coupled to the first edge 3a of the first resistor 2, and the second pad 16 is electrically coupled to the second edge 3b of the first resistor 2. Also, the first resistor 2 and the first and second electrodes 13, 14 are coated with a surface protection film 9 (e.g., $SiO_2$ film).

Figure 4:
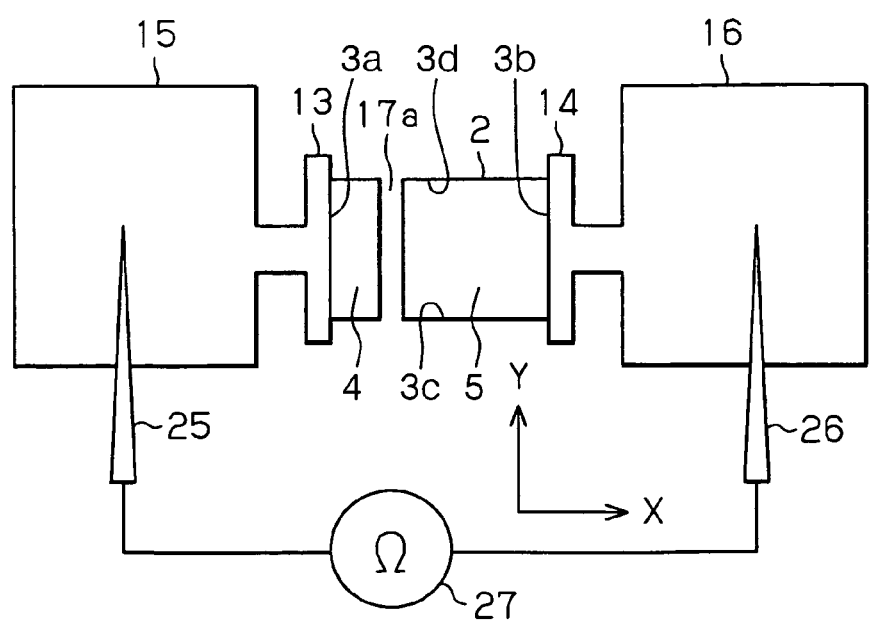
FIG. 4 is a plan view of a thin film resistor that includes a first trim cut.

Moreover, a measuring device 27 is included in FIG. 4. As shown in FIG. 4, a first probe 25 establishes electrical communication between the first pad 15 and the measuring device 27, and a second probe 26 establishes electrical communication between the second pad 16 and the measuring device 27. As such, the measuring device 27 is operable to measure the insulation resistance of the first resistor 2.

As shown in FIG. 2A, the second thin film resistor 18 is intended to be laser trimmed to form a trim cut 19 (shown in broken lines in FIG. 2A). Before the trim cut 19 is formed, however, the proper parameters for laser trimming the second thin film resistor 18 are identified.

To identify the proper parameters for laser trimming of the second resistor 18, a first trim cut 17a (see FIG. 4) is formed in the first thin film resistor 2. In one embodiment, the first trim cut 17a is formed so as to extend in the same linear direction as the trim cut 19 intended for the second thin film resistor 18. More specifically, in the embodiment shown in FIG. 2A, the trim cut 19 is intended to extend in the Y-direction; therefore, the first trim cut 17a is likewise formed so as to extend in the Y-direction as shown in FIG. 4.

Once formed, the first trim cut 17a bisects the first resistor 2 such that the first resistor 2 is divided into a first portion 4 and a second portion 5. Specifically, the first trim cut 17a extends from the third edge 3c to the fourth edge 3d, and the first trim cut 17a is approximately orthogonal to the third and fourth edges 3c, 3d. The first trim cut 17a is interposed between the first and second pads 15, 16 so as to be approximately parallel to the first and second pads 15, 16. As a result, the first pad 15 is electrically coupled to the first portion 4, and the first pad 15 is separated from the second portion 5 by the first trim cut 17a. In addition, the second pad 16 is electrically coupled to the second portion 5, and the second pad 16 is separated from the first portion 4 by the first trim cut 17a. It will be appreciated, however, that the first trim cut 17a could be formed in any suitable direction.

Once the first trim cut 17a is formed, the measuring device 27 is used to detect electrical characteristics (e.g., the insulation resistance) of the first resistor 2. This data can be used for evaluating the trim cut 17a and for evaluating the laser trimming process used to form the trim cut 17a. For example, the data can be used to determine whether uncut parts are generated, whether the laser beam Lb is misfocused, whether the trimming window is adequate, and/or whether the laser intensity is adequate.

For instance, an operative laser intensity for laser trimming the second resistor 18 is determined in one embodiment. To determine the operative laser intensity, the first resistor 2 is repeatedly laser trimmed at progressively increased laser intensities until the insulation resistance of the first resistor is approximately equal to a predetermined value. In other words, the first resistor 2 is repeatedly laser trimmed at progressively increased laser intensities until the insulation resistance of the first resistor 2 indicates that the trim cut is complete.

Figure 5:
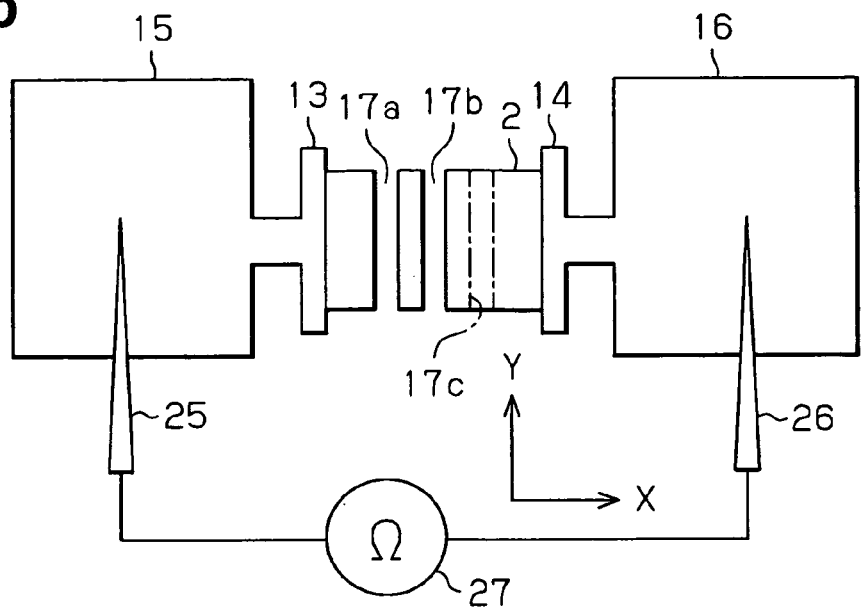
FIG. 5 is a plan view of the thin film resistor of FIG. 4 that includes additional trim cuts.

More specifically, the first trim cut 17*a* is created with the laser beam Lb intensity set at a predetermined value. Then, the insulation resistance of the first thin film resistor 2 is measured. This measured insulation resistance is compared to the predetermined insulation resistance. If the measured insulation resistance is not approximately equal to the predetermined insulation resistance, then the laser intensity is increased, and an additional trim cut 17*b* is formed in the first resistor 2 as shown in FIG. 5. (As shown, the additional trim cut 17*b* is approximately parallel to the first trim cut 17*a* and bisects the first resistor 2 similar to the first trim cut 17*a*.) Next, the insulation resistance of the first resistor 2 is measured again. If the insulation resistance is not approximately equal to the predetermined insulation resistance value, the laser intensity is further increased, and an additional trim cut 17*c* is formed as shown in FIG. 5. The laser intensity is increased and additional trim cuts are formed in the first resistor 2 until the insulation resistance is approximately equal to the predetermined insulation resistance value. At this point, the proper laser intensity is revealed, and the second resistor 18 is trimmed at that laser intensity.

In one embodiment, for instance, trim cuts are formed in the first resistor 2 until the insulation resistance is approximately 100 MΩ or above. In other words, it can be expected that uncut parts remain in the trim cuts 17*a*, 17*b*, 17*c* if the insulation resistance is lower than 100 MΩ. Thus, as an example, a laser energy of 0.25 μJ is used to create the first trim cut 17*a*. Then, the measuring device 27 detects that the insulation resistance of the first resistor 2 is 1 kΩ. This measured insulation resistance is lower than 100 MΩ, so an additional trim cut 17*b* is formed at a laser energy of 0.35 μJ. A measurement of the first resistor 2 reveals that the insulation resistance is above 100 MΩ, thereby revealing that the trim cut 17*b* is sufficiently complete (i.e., uncut parts are not present). Accordingly, the second resistor 18 is trimmed at the laser energy of 0.35 μJ or more such that the trim cut 19 (FIG. 2A) is complete and defects are unlikely to be created.

It will be appreciated that if the insulation resistance is below 100 MΩ after forming the additional trim cut 17*b*, an additional trim cut 17*c* is created at a higher laser intensity. This process of increasing the laser intensity, creating additional trim cuts, and measuring the insulation resistance is repeated until the insulation resistance of the first resistor 2 is approximately 100 MΩ or above. It will also be appreciated that if the first resistor 2 has an insulation resistance of 100 MΩ after the first trim cut 17*a* is formed, then laser trimming of the first resistor 2 is complete, and the trim cut 19 is formed in the second resistor 18 at the laser intensity used to form the first trim cut 17*a*.

The laser intensity can be adjusted by any suitable amount. When the laser intensity is adjusted by smaller increments, laser trimming and measurement will likely be performed a greater number of times before the appropriate laser intensity is discovered. However, the laser intensity discovered in the process may be more accurate. On the contrary, if the laser intensity is adjusted by larger increments, laser trimming and measurement will likely be performed fewer times before the appropriate laser intensity is discovered. However, the laser intensity discovered in the process may be less accurate.

In one embodiment, trim cuts are evaluated (i.e., uncut parts are identified) and desirable laser intensities are identified by making trim cuts at a plurality of locations on the wafer 1. For instance, in the embodiment shown in FIG. 1, trim cuts are made in nine different first resistors 2.

In one embodiment, each of the first resistors 2 is laser trimmed and a laser intensity adequate for trimming each of the first resistors 2 is identified. The highest laser intensity identified is then regarded as the laser intensity for trimming all of the second thin film resistors 18 on the wafer 1.

It will be appreciated that the laser intensity may vary depending on the position of the laser apparatus 20 relative to the surface of the wafer 1. As such, a first resistor 2 and a second resistor 18 may be included in each IC chip on the wafer 1, and the first resistors 2 are trimmed in the above-described manner to thereby identify a proper laser intensity for each IC chip. Then, the second resistors 18 are trimmed at the laser intensity identified for the particular IC chip. As a result, uncut parts are unlikely to be generated when laser trimming.

Advantageously, the trim cuts 17 of the first resistor 2 can be evaluated more reliably. The trim cuts 17 are analyzed via an electrical analysis, rather than a visual analysis, which can be more accurate. Accordingly, the trim cut 19 of the second resistor 18 can be formed such that uncut parts are unlikely to be created in the trim cut 19. Furthermore, the laser intensity for creating the trim cut 19 can be accurately determined before the trim cut 19 is created. As such, defects are less likely to be created.

In one embodiment, the trim cut(s) 17*a*, 17*b*, 17*c* are formed in the first resistor 2 in a direction that corresponds to the direction of the trim cut 19 to be formed in the second resistor 18. For example, in the embodiment described above and shown in FIGS. 2A, 4, and 5, the trim cuts 17*a*, 17*b*, 17*c* formed in the first resistor 2 each extend in the Y-direction because the trim cut 19 of the second resistor 18 is to extend in the Y-direction as well. Alternatively, as shown in the embodiments of FIGS. 7A, 7B, 8, and 9, the trim cuts formed in the first resistor 2 extend in a direction that corresponds to trim cuts of the second resistor 18.

Figure 7A:
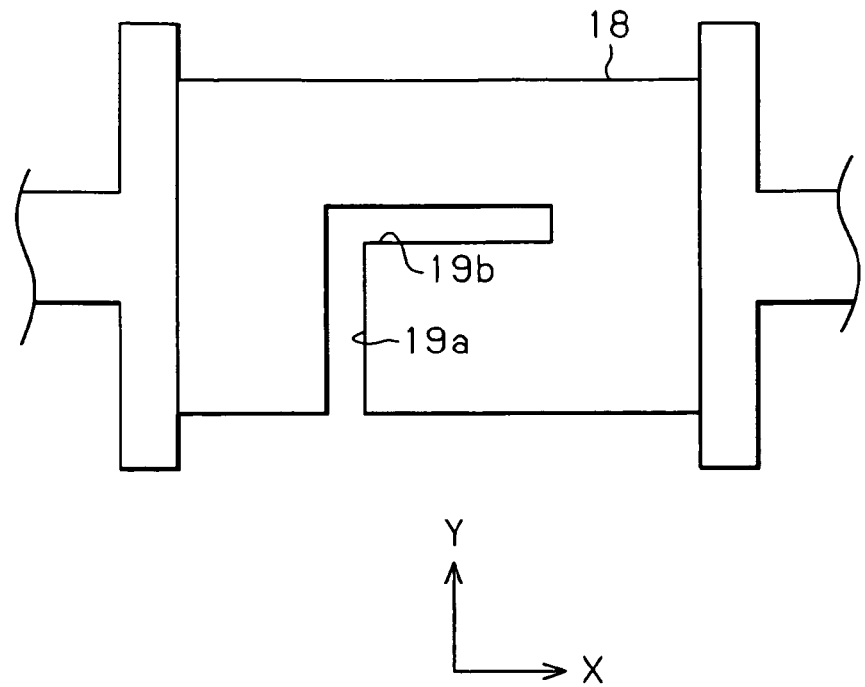
FIGS. 7A and 7B are plan views of thin film resistors that include trim cuts extending in a variety of directions.
Figure 8:
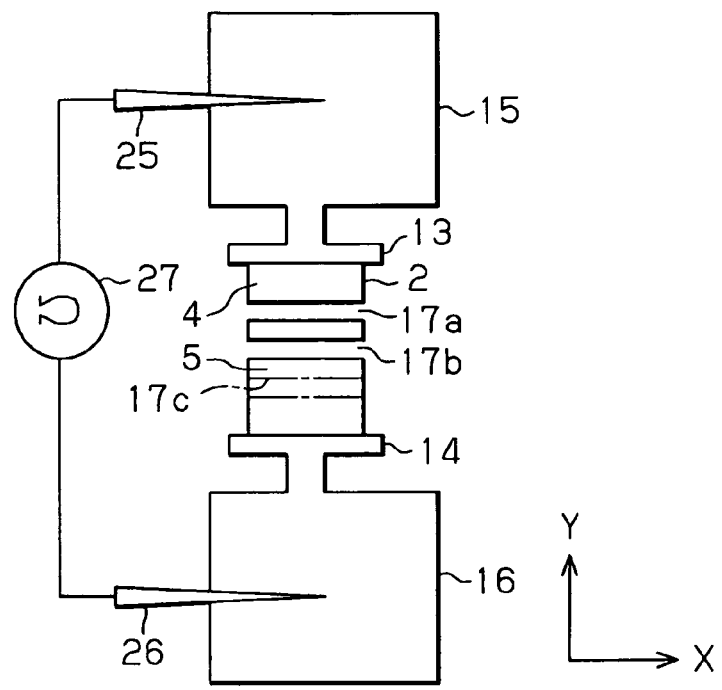
FIG. 8 is a plan view of a thin film resistor with a trim cut that extends in a direction corresponding to one of the trim cuts of FIG. 7A.

Specifically, in the embodiment shown in FIG. 7A, the second resistor 18 includes a trim cut 19*b* that extends in the X-direction. Thus, as shown in FIG. 8, trim cuts 17*a*, 17*b*, 17*c* each bisect the first resistor 2 in the X-direction. More specifically, the first trim cut 17*a* bisects the first resistor 2 such that the first resistor 8 is divided into a first portion 4 and a second portion 5, and the trim cut 17*a* is interposed between the first pad 15 and the second pad 16. The first pad 15 is coupled to the first portion 4, and the first trim cut 17*a* separates the first pad 15 from the second portion 5. The second pad 16 is coupled to the second portion 5, and the first trim cut 17*a* separates the second pad 16 from the first portion 4. The additional trim cuts 17*b*, 17*c* are each approximately parallel to the first trim cut 17*a* and are disposed in spaced relationship relative to the first trim cut 17*a* along the Y-direction.

Figure 7B:
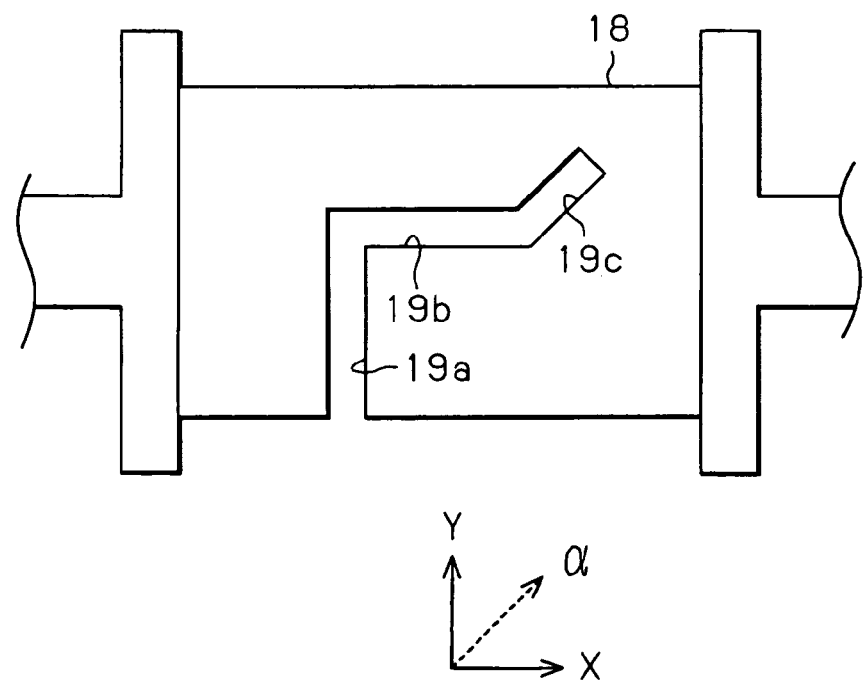
Figure 9:
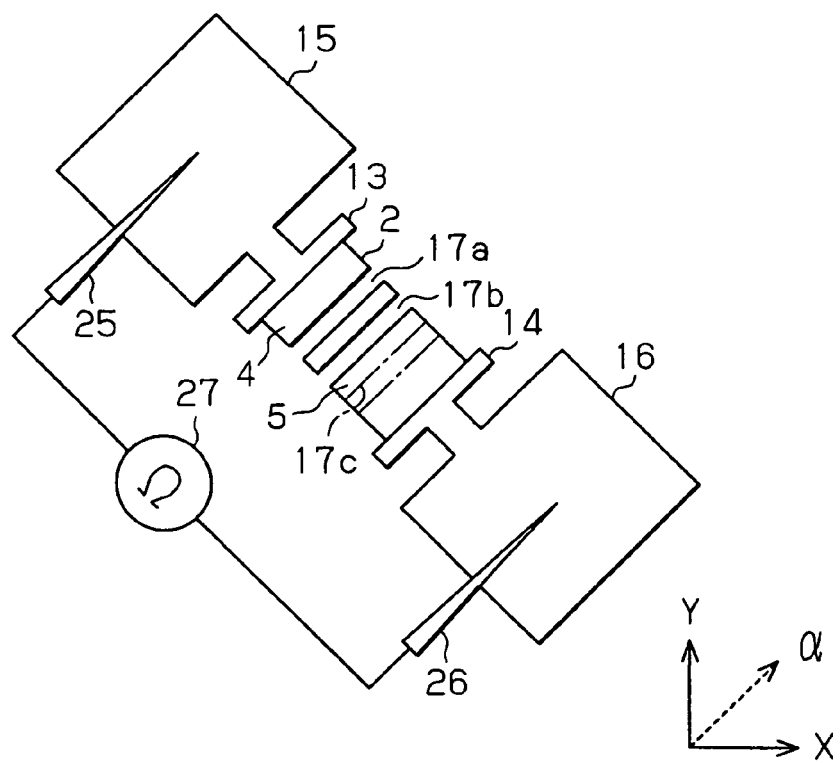
FIG. 9 is a plan view of a thin film resistor with a trim cut that extends in a direction corresponding to a trim cut of FIG. 7B.
Figure 10A:
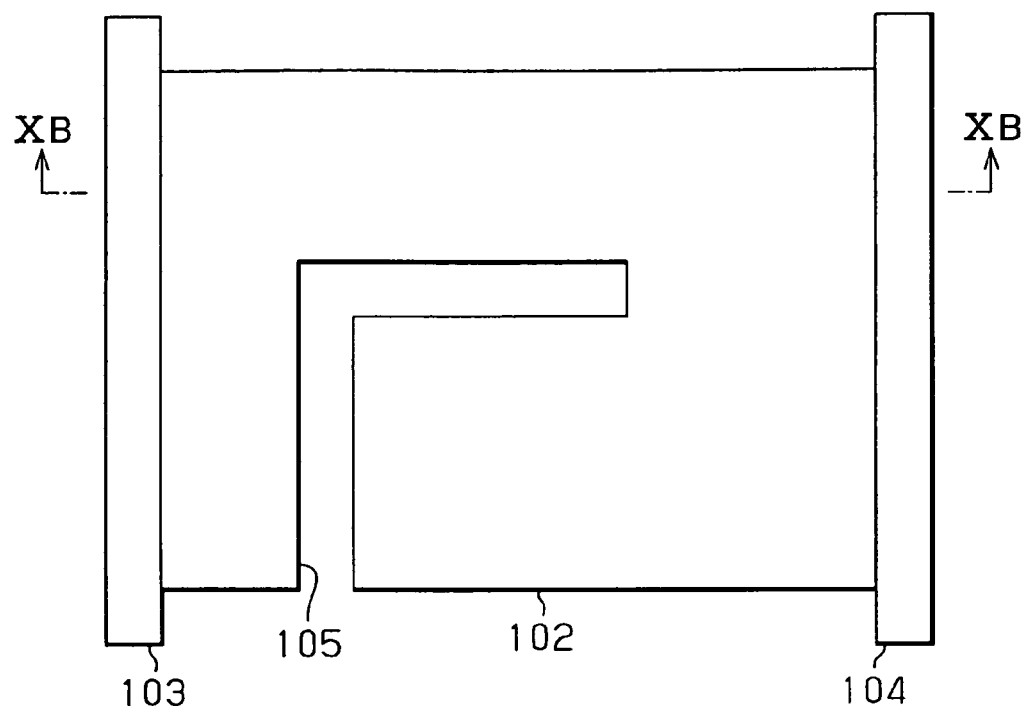
FIG. 10A is a plan view of a thin film resistor for explaining the prior art.
Figure 10B:
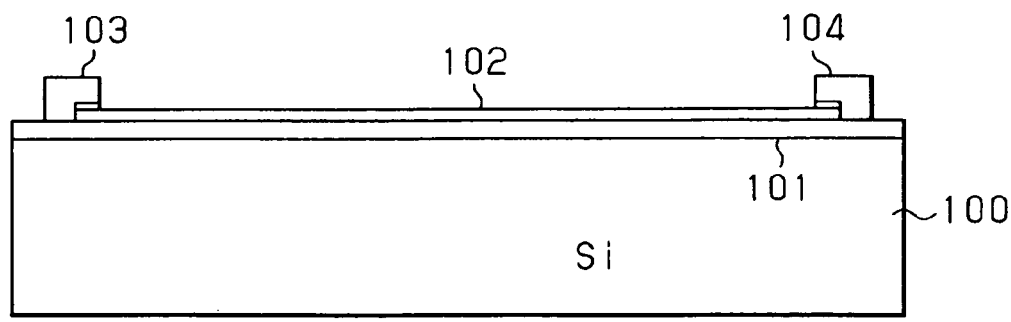
FIG. 10B is a longitudinal sectional view taken along the line XB-XB of FIG. 10A.
Figure 11A:
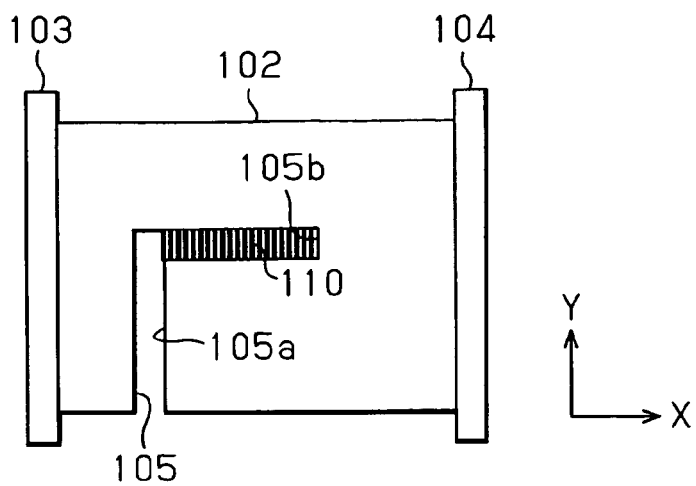
FIGS. 11A, 11B, and 11C are plan views of thin film resistors for explaining the prior art.
Figure 11B:
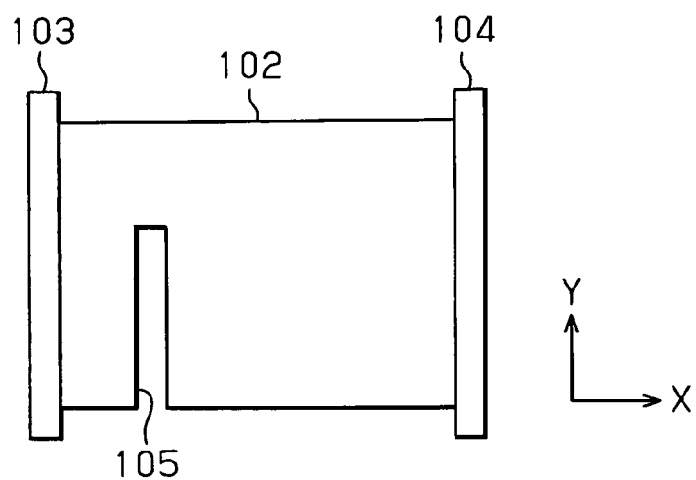
Figure 11C:
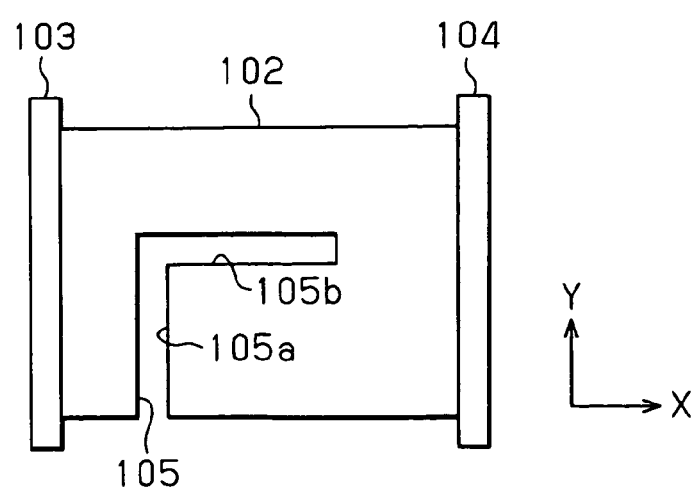

Similarly, in the embodiment shown in FIG. 7B, the second resistor 18 includes a trim cut 19*c* that extends in the α-direction. (The α-direction could be at any suitable angle relative to the X- and Y-axes.) Thus, as shown in FIG. 9, trim cuts 17*a*, 17*b*, 17*c* each bisect the first resistor 2 in the α-direction. More specifically, the first trim cut 17*a* bisects the first resistor 2 such that the first resistor 8 is divided into a first portion 4 and a second portion 5, and the trim cut 17*a* is interposed between the first pad 15 and the second pad 16. The first pad 15 is coupled to the first portion 4, and the first trim cut 17*a* separates the first pad 15 from the second portion 5. The second pad 16 is coupled to the second portion 5, and the first trim cut 17*a* separates the second pad 16 from the first portion 4. The additional trim cuts 17*b*, 17*c* are each approximately parallel to the first trim cut 17a and are disposed in spaced relationship relative to the first trim cut 17a in a direction normal to the α-direction.

Furthermore, in the embodiment shown in FIG. 7A, the second resistor 18 includes a first trim cut 19a extending in the Y-direction, and a second trim cut 19b extending in the X-direction. In order to identify an adequate laser intensity for each of the trim cuts 19a, 19b of FIG. 7A, a first resistor 2 is laser trimmed in the Y-direction (e.g., the first resistor 2 shown in FIG. 5), and another first resistor 2 is laser trimmed in the X-direction (e.g., the first resistor 2 shown in FIG. 8).

Likewise, in the embodiment shown in FIG. 7B, the second resistor 18 includes a first trim cut 19a extending in the Y-direction, a second trim cut 19b extending in the X-direction, and a third trim cut 19c extending in the α-direction. In order to identify a proper laser intensity for each of the trim cuts 19a, 19b, 19c of FIG. 7B, a first resistor 2 is laser trimmed in the Y-direction (e.g., the first resistor 2 shown in FIG. 5), another first resistor 2 is laser trimmed in the X-direction (e.g., the first resistor 2 shown in FIG. 8), and still another first resistor 2 is laser trimmed in the α-direction (e.g., the first resistor 2 shown in FIG. 9). As such, the second resistor 18 can be laser trimmed at a more accurate laser intensity, regardless of the direction for trimming the second resistor 18.

In one embodiment, the first pad 15 and the second pad 16 associated with the first resistor 2 are electrically isolated from other electrical components of the IC chip. In another embodiment, the first pad 15 and the second pad 16 are in electrical communication with other components of the IC chip. This embodiment is illustrated in FIG. 6.

Figure 6:
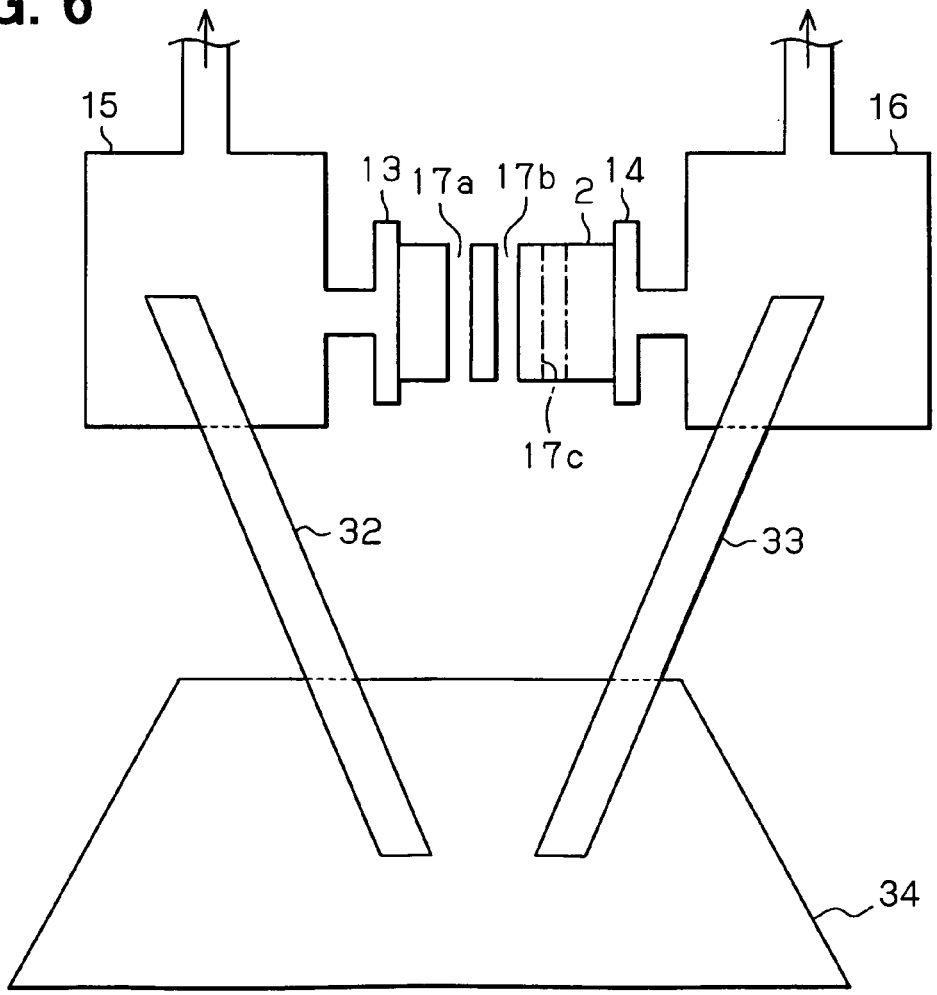
FIG. 6 is a plan view of another exemplary thin film resistor.

Specifically, in FIG. 6, the first pad 15 is a grounding pad that is in electrical communication with other components of a digital circuit. The second pad 16 is a grounding pad that is in electrical communication with other components of an analog circuit. It will be appreciated that the first and second pads 15, 16 may be other circuit elements, such as power supply pads, rather than grounding pads. As such, the first and second pads 15, 16 are in electrical communication with ground terminals (or power supply terminals) of separate circuits on the IC chip.

The first resistor 2 is interposed between the first and second pads 15, 16 similar to the embodiment described above in relation to FIG. 2B. Furthermore, the first pad 15 and the second pad 16 are at a predetermined electrical potential so as to function within the respective circuit(s) of the IC chip. Accordingly, the first and second pads 15, 16 can serve as electrodes for measurement of the insulation resistance of the resistor 2, and the first and second pads 15, 16 can also serve as elements of a circuit within the IC chip, such as pads for the IC power supply or as grounding pads.

Specifically, after the trim cuts 17a, 17b, 17c are created in the first resistor 2 and a suitable laser intensity is identified, the first and second pads 15, 16 are electrically connected to a lead frame 34 for grounding terminals (or a lead frame for power supply terminals) through bonding wires 32 and 33. It will be appreciated that the first pad 15 and the second pad 16 are electrically insulated from each other as a result of trimming of the resistor 2. Thus, a voltage fluctuation in the digital circuit is unlikely to affect the analog circuit, and a voltage fluctuation in the analog circuit is unlikely to affect the digital circuit.

The present invention has been described in an illustrative manner. It is to be understood that the terminology, which has been used, is intended to be in the nature of words of description rather than of limitation. Many modifications and variations of the present invention are possible in light of the above teachings. Therefore, within the scope of the appended claims, the present invention may be practiced other than as specifically described.

What is claimed is:

1. A method of manufacturing a semiconductor device having a thin film resistor, the method comprising the steps of:
   providing (i) a first thin film resistor only for evaluation of a laser trimming process, and (ii) a second thin film resistor as the thin film resistor of the semiconductor device;
   laser trimming the first thin film resistor by creating a trim cut that bisects the first thin film resistor such that the first thin film resistor is divided into a first portion and a second portion;
   measuring insulation resistance of the first thin film resistor;
   evaluating the trim cut based on the measured insulation resistance in order to determine an appropriate laser trimming parameter for the second thin film resistor; and
   laser trimming the second thin film resistor by using the laser trimming parameter determined in the evaluating step.

2. The method of manufacturing a semiconductor device according to claim 1, wherein
   the step of providing comprises providing the first thin film resistor that is interposed between a first pad and a second pad, and wherein
   the step of laser trimming the first thin film resistor comprises creating the trim cut interposed between the first pad and the second pad.

3. The method of manufacturing a semiconductor device according to claim 2, wherein
   the step of laser trimming the first thin film resistor further comprises creating a plurality of trim cuts parallel to each other.

4. The method of manufacturing a semiconductor device according to claim 2, wherein:
   the step of laser trimming the first thin film resistor trims provides
   the first pad being coupled to the first portion,
   the first pad being separated from the second portion by the trim cut,
   the second pad being coupled to the second portion, and
   the second pad being separated from the first portion by the trim cut.

5. The method of manufacturing a semiconductor device according to claim 4, wherein:
   the step of providing provides
   the first thin film resistor being rectangular in shape so as to define a first edge, a second edge, a third edge, and a fourth edge;
   the first pad being coupled to the first edge, and
   the second pad being coupled to the second edge, and wherein
   the step of laser trimming the first thin film resistor comprises creating the trim cut so as to extend from the third edge to the fourth edge and approximately orthogonal to the third and fourth edges.

6. The method of manufacturing a semiconductor device according to claim 2, wherein
   the step of providing provides
   the first pad being at a predetermined electric potential of a circuit, and
   the second pad being at a predetermined electric potential of a separate circuit.

7. The method of manufacturing a semiconductor device according to claim 1, wherein
the step of laser trimming the first thin film resistor uses a laser intensity of a predetermined value, wherein
the step of evaluating determines an operative laser intensity based on the measured insulation resistance of the first thin film resistor, and
the step of laser trimming the second thin film resistor uses the operative laser intensity.

8. The method of manufacturing a semiconductor device according to claim 7, wherein the step of evaluating comprises:
a) comparing the measured insulation resistance to a predetermined insulation resistance;
b) increasing the laser intensity if the measured insulation resistance is unequal to the predetermined insulation resistance;
c) further laser trimming the first thin film resistor by creating an additional trim cut that additionally bisects the first thin film resistor by using the increased laser intensity increased in step (b);
d) measuring the insulation resistance of the first thin film resistor after step (c); and
e) repeating steps (b), (c), and (d) until the insulation resistance of the first thin film resistor measured in step (d) is approximately equal to the predetermined insulation resistance.

9. The method of manufacturing a semiconductor device according to claim 8, wherein
the step of further laser trimming the first thin film resistor creates the additional trim cut interposed between a first pad and a second pad.

10. The method of manufacturing a semiconductor device according to claim 9, there being plural additional trim cuts, wherein
the trim cut and each plural additional trim cut are parallel to each other.

11. The method of manufacturing a semiconductor device according to claim 9,
the first thin film resistor being rectangular in shape so as to define a first edge, a second edge, a third edge, and a fourth edge
the first pad being coupled to the first edge
the second pad being coupled to the second edge, and
the first trim cut and all additional trim cuts extending from the third edge to the fourth edge approximately orthogonal to the third and fourth edges.

12. The method of manufacturing a semiconductor device according to claim 9,
the first pad being at a predetermined electric potential of a circuit, and
the second pad being at a predetermined electrical potential of a separate circuit.

13. The method of manufacturing a semiconductor device according to claim 8, wherein
the predetermined insulation resistance measured in step (d) is 100 MΩ or above.

14. The method of manufacturing a semiconductor device according to claim 7, wherein
the step of laser trimming the first thin film resistor creates the trim cut in a direction that corresponds to the direction of a trim cut to be formed in the second thin film resistor.

15. The method of manufacturing a semiconductor device according to claim 7,
the first thin film resistor being electrically isolated from a circuit, and
the second thin film resistor being in electrical communication with the circuit.

* * * * *